United States Patent
Saiki et al.

(10) Patent No.: US 7,394,134 B2
(45) Date of Patent: Jul. 1, 2008

(54) SEMICONDUCTOR DEVICE WITH ELECTROSTATIC DISCHARGE PROTECTION

(75) Inventors: Takayuki Saiki, Nagano (JP); Kazuhiko Okawa, Nagano (JP)

(73) Assignee: Seiko Epson Corporation (JP)

( * ) Notice: Subject to any disclaimer, the term of this patent is extended or adjusted under 35 U.S.C. 154(b) by 205 days.

(21) Appl. No.: 11/095,709

(22) Filed: Mar. 31, 2005

(65) Prior Publication Data

US 2005/0218454 A1    Oct. 6, 2005

(30) Foreign Application Priority Data

Apr. 1, 2004   (JP) ............... 2004-109162

(51) Int. Cl.
*H01L 23/62* (2006.01)
(52) U.S. Cl. .............. 257/358; 257/359; 257/360; 257/E23.145
(58) Field of Classification Search .......... 257/358, 257/359, 360, E23.145
See application file for complete search history.

(56) References Cited

U.S. PATENT DOCUMENTS

| | | | | |
|---|---|---|---|---|
| 6,479,870 | B1 * | 11/2002 | Chen et al. ............ | 257/355 |
| 6,759,716 | B1 | 7/2004 | Morishita | |
| 6,784,498 | B1 * | 8/2004 | Lee et al. ............ | 257/361 |
| 6,858,901 | B2 * | 2/2005 | Ker et al. ............ | 257/360 |
| 6,876,041 | B2 * | 4/2005 | Lee et al. ............ | 257/358 |
| 7,012,308 | B2 * | 3/2006 | Kato et al. ............ | 257/360 |
| 2003/0197246 | A1 * | 10/2003 | Ker et al. ............ | 257/565 |

FOREIGN PATENT DOCUMENTS

| | | |
|---|---|---|
| JP | 07-106567 | 4/1995 |
| JP | 08-078413 | 3/1996 |
| JP | 2000-040788 | 2/2000 |
| JP | 2000-058762 | 2/2000 |
| JP | 2001-036006 | 2/2001 |
| JP | 2002-110909 | 4/2002 |

OTHER PUBLICATIONS

Communication from Japanese Patent Office re: related application, May 9, 2005.

* cited by examiner

*Primary Examiner*—Phat X Cao
(74) *Attorney, Agent, or Firm*—Harness, Dickey & Pierce, P.L.C.

(57) ABSTRACT

A semiconductor device is provided having a high performance resistance element. In an N-type well isolated by an insulating film, two higher concentration N-type regions are formed. An interlayer insulating film is also formed. In a plurality of openings in the interlayer insulating film, one electrode group having a plurality of electrodes is formed on one N-type region, while a second electrode group having a plurality of electrodes is formed on the other N-type region. The relationship between the two N-type regions is between an island region and an annular region surrounding the island. The annular region of the N-type well between the island region and the annular region serves as a resistor R. Thus, discharge channels for charges applied excessively because of ESD or the like evenly exist in the periphery (four regions) of the one N-type region.

28 Claims, 4 Drawing Sheets

SEMICONDUCTOR DEVICE WITH ELECTROSTATIC DISCHARGE PROTECTION

RELATED APPLICATIONS

This application claims priority to Japanese Patent Application No. 2004-109162 filed Apr. 1, 2004 which is hereby expressly incorporated by reference herein in its entirety.

BACKGROUND

1. Technical Field

The present invention relates to a semiconductor device used in a semiconductor integrated circuit and having a protective resistance element, and a method for manufacturing the same.

2. Related Art

The smaller the size of input-output transistors become because of trends toward microminiaturization of semiconductor integrated circuits, the more easily the breakdown of gate oxide films due to electrostatic discharge (ESD) is caused. One of anti-electrostatic measures is to provide an input-output protective device upstream of input-output transistors. For example, the input-output protective device includes a parasitic bipolar transistor, and dissipates a current by bipolar operation to protect input-output transistors when an excess voltage such as ESD is transmitted from pads (for example, refer to Japanese Unexamined Patent Publication No. 2001-36006 (p. 3-4, FIG. 1)).

In some input-output transistors having a certain size or structure, the provision of an input-output protective device is not required and a resistance element, which is inexpensive, contributes to electrostatic protection. Even in a structure including an input-output protective device, it is important to provide a resistance element between pads and the input-output protective device, or upstream of input-output transistors, for inducing an adequate voltage drop. Typical one of various configurations of these resistance elements is a diffused resistor (well resistor). At present, such a diffused resistor does not have a preferable structure since anti-electrostatic measures are insufficient, and therefore there is a room for improvement.

Resistance elements made up of the above diffused resistor (well resistor) are formed simultaneously with a forming step of other transistor elements or the like. Therefore, the impurity concentration of the resistance elements is not adjusted independently in general. Thus the resistance value is adjusted with the length and width of a diffused region between coupled wires. This sometimes makes it difficult to form a desired resistance element within a limited region. Also, since discharge channel is along a single direction, charges applied excessively because of ESD or the like may damage resistors.

The present invention is made in consideration of the above circumstances, and is intended to provide a semiconductor device having an inexpensive and high performance resistance element that can ensure, within a more reduced area, a large area for discharging excess charges due to ESD or the like. The present invention is also intended to provide a method for manufacturing the semiconductor device.

SUMMARY

A semiconductor device according to the present invention comprises: a semiconductor base of a first conductivity type; a first conductive coupling region of the first conductivity type provided on the semiconductor base; a second conductive coupling region of the first conductivity type provided on the semiconductor base so as to surround the first conductive coupling region; a first electrode group having a plurality of electrodes that is provided on the first conductive coupling region; and a second electrode group having a plurality of electrodes that is provided on the second conductive coupling region.

A semiconductor device according to the present invention comprises: a semiconductor base of a first conductivity type; a first insulating film provided on the semiconductor base; a first conductive coupling region of the first conductivity type in a center part and a second conductive coupling region of the first conductivity type surrounding the first conductive coupling region, the first and second conductive coupling regions being isolated from each other by the first insulating film; a second insulating film provided on the first conductive coupling region and the second conductive coupling region; a first electrode group having a plurality of electrodes that is provided on the first conductive coupling region via a plurality of openings in the second insulating film; a second electrode group having a plurality of electrodes that is provided on the second conductive coupling region via a plurality of openings in the second insulating film; a first wiring pattern coupled to a plurality of predetermined electrodes of the first electrode group; and a second wiring pattern coupled to a plurality of predetermined electrodes of the second electrode group.

According to the semiconductor device of the present invention, the relationship between the first conductive coupling region and the second conductive coupling region is one between an island region and an annular region surrounding the island. The annular region between the island region and the annular region serves as a resistor. Thus, discharge channels for charges applied excessively because of ESD or the like evenly exist in the periphery (four regions) of the first conductive coupling region.

Also, a silicide metal layer is preferably formed in the first conductive coupling region and the second conductive coupling region except for a predetermined region adjacent to the first insulating film. That is, for a layer having a silicide metal layer on the surface thereof, regions free of a silicide metal layer are preferably formed in end (edge) parts of regions serving as the resistor in order to avoid the concentration of charges.

In the semiconductor device according to the present invention, the semiconductor base is one well region provided on a semiconductor substrate, and the semiconductor base between the first conductive coupling region and the second conductive coupling region functions as a resistor. The resistor can be formed simultaneously with a step of forming other elements, which provides advantages in manufacturing efficiency and manufacturing costs.

In addition, in the semiconductor device according to the present invention, the semiconductor base has a pattern that is at least fourfold symmetric about a center of the first conductive coupling region, and the semiconductor base between the first conductive coupling region and the second conductive coupling region functions as a resistor. The resistor can be formed simultaneously with a step of forming other elements, which provides advantages in manufacturing efficiency and manufacturing costs. In addition, a resistance element in which a pattern is fourfold symmetric about the first electrode group can be formed. This allows greater flexibility in the coupling structure of the second electrode group.

In the semiconductor device according to the present invention, a peripheral electrode of the first electrode group in a predetermined number is arranged closest to an edge of the first conductive coupling region in four regions, and an electrode of the second electrode group in a predetermined number is arranged in four regions so as to face the peripheral electrode of the first electrode group.

Furthermore, in the semiconductor device according to the present invention, the first electrode group is distributed in a whole region from a center of the first conductive coupling region to a predetermined region. A peripheral electrode of the first electrode group in a predetermined number is arranged closest to an edge of the first conductive coupling region in four regions, and an electrode of the second electrode group in a predetermined number is arranged in four regions so as to face at least the peripheral electrode of the first electrode group in a predetermined number.

Also, in the semiconductor device according to the present invention, the first conductive coupling region has a planar shape obtained by removing four corner parts from a quadrangle and having at least four sides. The first electrode group is prepared so that an electrode in a predetermined number is arranged along the four sides, and an electrode of the second electrode group in a predetermined number is arranged so as to face at least the electrode of the first electrode group in a predetermined number.

According to the semiconductor device of the present invention, both ends of a resistor are made up of one-to-one correspondences between a predetermined number of electrodes and therefore regions preferentially serving as a resistor are established. This allows a structure that is easier to be designed as a resistance element. Here, it is also important that a distance between the first conductive coupling region and the second conductive coupling region in a region in which the first electrode group faces the second electrode group is smaller than a distance between the first conductive coupling region and the second conductive coupling region in other regions.

A method for manufacturing a semiconductor device according to the present invention comprises: forming an annular first insulating film on a semiconductor base; forming, with using the first insulating film as a mask, a first conductive coupling region of a first conductivity type in a center part of the semiconductor base and a second conductive coupling region of the first conductivity type in a periphery of the first conductive coupling region; forming a second insulating film on the first conductive coupling region and the second conductive coupling region; and forming a first electrode group and a second electrode group that have a plurality of electrodes on the first conductive coupling region and the second conductive coupling region, respectively, via a plurality of openings in the second insulating film.

According to the method for manufacturing a semiconductor device of the present invention, the first conductive coupling region and the second conductive coupling region are formed as an island region and an annular region surrounding the island. The annular region between the island region and the annular region serves as a resistor. By forming the first electrode group and the second electrode group that have a plurality of electrodes, charges that have been excessively applied because of ESD or the like can be discharged toward the periphery (four directions) of the first conductive coupling region evenly.

The method for manufacturing a semiconductor device preferably further comprises forming a first wiring pattern coupled to a plurality of predetermined electrodes of the first electrode group and a second wiring pattern coupled to a plurality of predetermined electrodes of the second electrode group.

In the method for manufacturing a semiconductor device according to the present invention, the semiconductor base is one well region provided on a semiconductor substrate, and forms a resistor, between the first conductive coupling region and the second conductive coupling region, that is at least fourfold symmetric about a center of the first conductive coupling region. Thus, a resistance element that is fourfold symmetric about the first electrode group can be formed. This allows greater flexibility in the coupling pattern of the second electrode group.

In the method for manufacturing a semiconductor device according to the present invention, an inner circumference of the first insulating film has an octagon shape that has at least longitudinal four sides, and an outer circumference forms regions of four sides facing the four sides. A width between the inner and outer circumferences in the regions of four sides is smaller than a width between the inner and outer circumferences in four corner regions. A structure in which designing of wiring and a resistance element is facilitated is achieved.

In the method for manufacturing a semiconductor device according to the present invention further comprises, prior to the step of forming the second insulating film: forming a protective layer for preventing silicidation that covers a predetermined region, of the first conductive coupling region and the second conductive coupling region, adjacent to at least the first insulating film; and forming a silicide metal layer on the first conductive coupling region and the second conductive coupling region except for the predetermined region. That is, end (edge) parts of regions serving as a resistor require a protective layer for preventing silicidation in order to avoid the concentration of charges.

DETAILED DESCRIPTION

Figure 1:
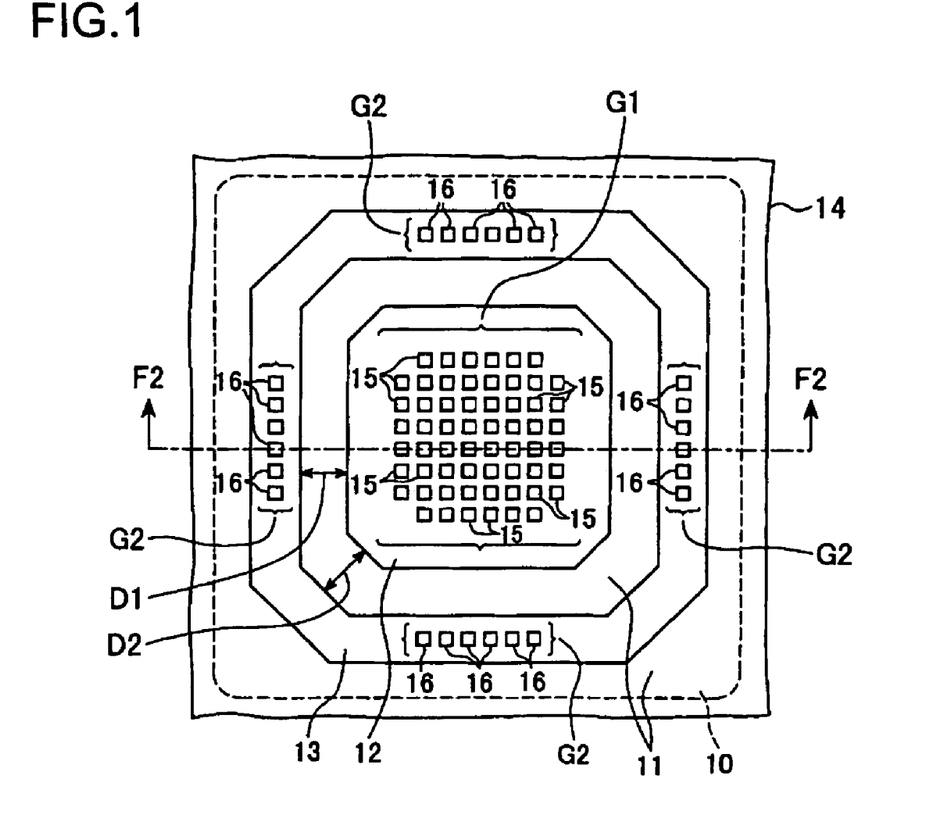
FIG. 1 is a plan view showing an essential part of a semiconductor device according to a first embodiment.
Figure 2:
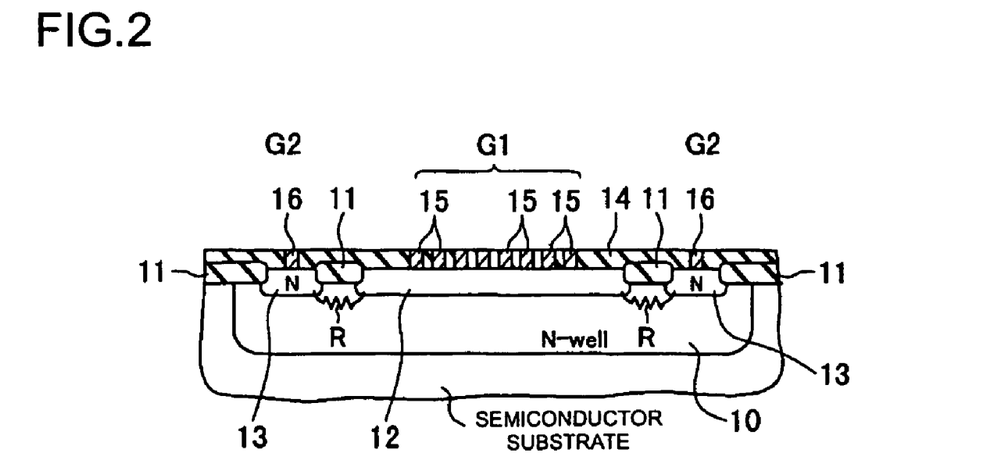
FIG. 2 is a sectional view along line F2-F2 in FIG. 1.

FIG. 1 is a plan view showing an essential part of a semiconductor device according to a first embodiment of the present invention. FIG. 2 is a sectional view along line F2-F2 in FIG. 2.

An insulating film 11 for isolation is formed on an N-type semiconductor base, for example, an N-type well 10, on a semiconductor substrate. In the N-type well 10 isolated by the insulating film 11 for isolation, N-type regions 12 and 13 into which an N-type impurity of higher concentration is further introduced are formed. That is, the N-type region 12 is formed at the center part and the N-type region 13 surrounds the N-type region 12. An interlayer insulating film 14 is formed. In a plurality of openings in the interlayer insulating film 14, an electrode group G1 having a plurality of electrodes 15 is formed on the N-type region 12, while an electrode group G2 having a plurality of electrodes 16 is formed on the N-type region 13. In other words, the N-type regions 12 and 13 serve as conductive coupling regions at both ends of a resistance region made of the N-type well 10. Ideally, the device has a fourfold symmetric pattern about the center of the N-type region 12, and the N-type well 10 between the N-type regions 12 and 13 serve as a resistor.

The insulating film 11 for isolation makes the N-type region 12 have a planar shape that is obtained by removing four corners from a quadrangle and has at least four sides. In the drawing, the shape of the N-type region 12 approximates an octagon shape having longitudinal four sides. The insulating film 11 for isolation also makes the shape of the N-type region 13 approximate an octagon shape in which both inner and outer circumferences have longitudinal four sides. Opposite distance D1 between the four sides of the N-type regions 12 and 13 is, at largest, smaller than opposite distance D2 between the sides of the N-type regions 12 and 13 at four corner regions.

The electrode group G1 is distributed in the whole region from the center of the N-type region 12 to a predetermined region. Peripheral electrodes of the electrodes 15 are arranged in a predetermined number (six in this embodiment) in four regions and are closest to the edges of the N-type region 12. A predetermined number (six in this embodiment) of the electrodes 16 of the electrode group G2 are arranged in four regions so as to face the peripheral electrodes 15 of the electrode group G1. The way of arranging the electrodes 16 is not limited to this embodiment in which the electrodes 16 are arranged in one row of a predetermined number (six) in each of four regions. The electrodes 16 may be arranged in a plurality of rows of a predetermined number (six).

A method for manufacturing a resistance element shown as a structure in FIGS. 1 and 2 is as follows. The insulating film 11 for isolation that is at least annular is formed on the N-type well 10. The insulating film 11 for isolation is formed so that the inner circumference thereof has an octagon shape having at least longitudinal four sides while the outer circumference thereof has four sides facing the four sides of the inner circumference. The width of the region between the four sides is set smaller than that at four corner regions (D1<D2).

Subsequently, an N-type impurity is ion-implanted into the center and peripheral parts of the N-type well 10 with using the insulating film 11 for isolation as a mask, to form the N-type regions 12 and 13. The kind and concentration of the ion depends on N-type regions of other semiconductor elements (not shown) that are formed simultaneously. Then, the interlayer insulating film 14 is formed on the whole surface by utilizing chemical vapor deposition (CVD) technique or the like. Thereafter a plurality of openings is formed in a predetermined region of the N-type regions 12 and 13 through steps of photolithography and etching. These openings are formed in the same step as a contact opening step related to other semiconductor elements (not shown).

Then, the electrode group G1 having the plural electrodes 15 are formed on the N-type region 12, and the electrode group G2 having the plural electrodes 16 are formed on the N-type region 13. These electrodes are formed in the same step as a wiring step related to other semiconductor elements (not shown). If a wiring step includes forming of plugs that fill the openings and patterning of a wiring layer, the electrode groups G1 and G2 are formed. However, if patterning of a wiring layer allows simultaneous filling of openings, a wiring pattern is formed simultaneously with the electrode groups G1 and G2. In addition, of the electrode group G2, the electrodes 16 are not formed in a region above which a wiring pattern coupled to the electrode group G1 runs through. Otherwise, a wiring pattern coupled to the electrode group G1 is formed in an upper layer than a layer of a wiring pattern coupled to the electrode group G2.

The structure and method of the above embodiment form the N-type regions 12 and 13 as an island region and an annular region surrounding the island, respectively. The annular region of the N-type well 10 between the island region (12) and the annular region (13) serves as a resistor R. Thus, discharge channels for charges applied excessively because of ESD or the like evenly exist in the periphery (four regions) of the N-type region 12. According to this, even if the occupation area of a well region is based on a minimum or near design rule, the larger effective width (length) of a resistance element can be ensured than conventional one. Furthermore, these elements can be formed simultaneously with a step of forming other elements, which provides advantages in manufacturing efficiency and manufacturing costs. Thus, the concentration of charges can be prevented with an inexpensive configuration and a high performance resistance element that is less subject to damage can be provided. In addition, a resistance element in which a pattern is fourfold symmetric about the center of the electrode group G1 can be formed. This allows greater flexibility in the coupling structure of the electrode group G2. Specifically, an essential part or all of the electrode group G2 can be utilized by using a multi-layered wiring pattern or the like.

Figure 3:
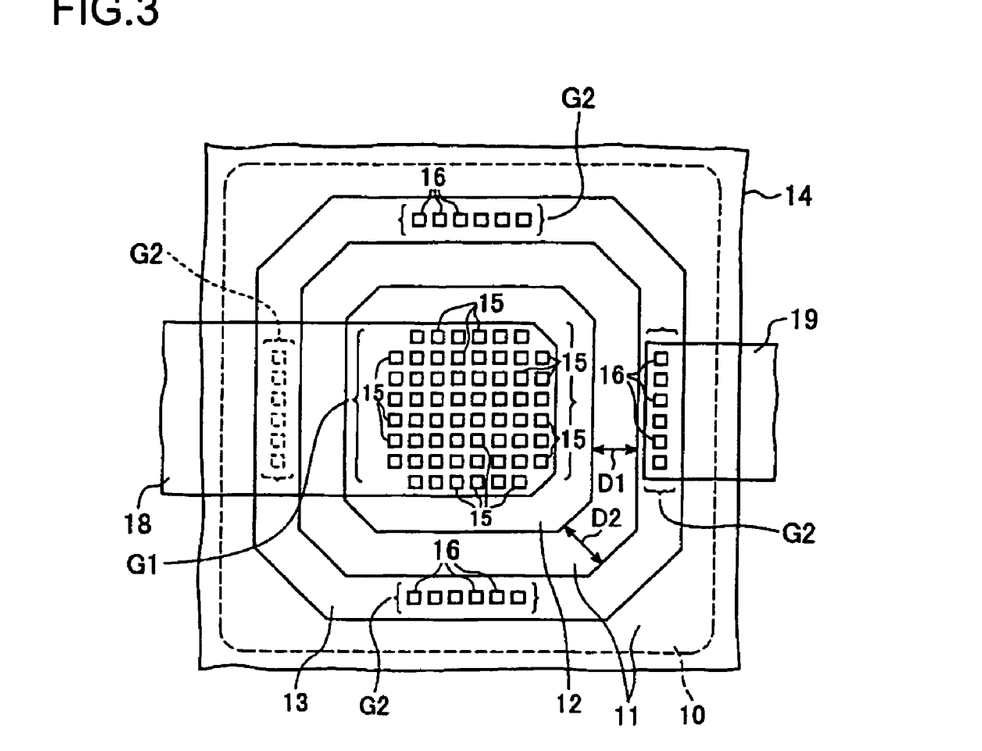
FIG. 3 is a plan view showing a structure including a wiring pattern in addition to the structure of FIG. 1.

FIG. 3 is a plan view showing a structure that further includes a wiring pattern for incorporating the structure of FIG. 1 as a resistance element into a semiconductor integrated circuit. Also, FIGS. 4A and 4B show input-output systems around IC chips and are circuit diagrams including a protective resistance element.

Referring to FIG. 3, a wiring pattern 18 is coupled to the plural electrodes 15 on the N-type region 12. A wiring pattern 19 is coupled to the plural electrodes 16 arranged in one of four-divided regions on the N-type region 13. The wiring patterns 18 and 19 may be formed simultaneously with a step of forming the electrodes 15 and 16. In this forming, the electrodes 16 (electrode group G2 shown with a dash line) are not formed in a region above which at least the wiring pattern 18 coupled to the electrode group G1 runs through. In addition, the wiring patterns 18 and 19 need not necessarily be formed of the same layer. Specifically, the wiring pattern 18 coupled to the electrode group G1 is formed in an upper layer than a layer of the wiring pattern 19 coupled to the electrode group G2. That is, stacking electrode groups in accord with wiring layers allows a structure having a pattern made up of different wiring layers.

Figure 4A:
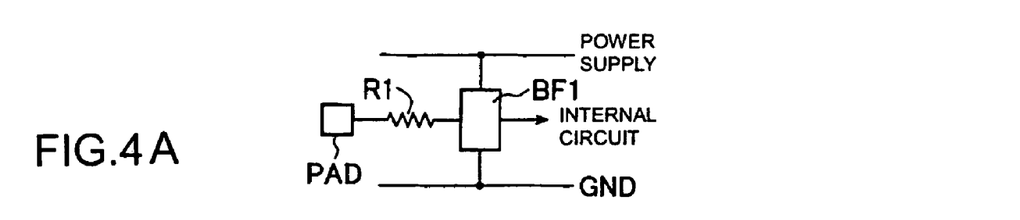
FIGS. 4A and 4B are circuit diagrams including a resistance element for protection in an input-output system around an IC chip.

Referring to FIG. 4A, one of signal lines in a semiconductor chip is extended from a pad PAD via a resistance element R1 for protection to a buffer BF1 so as to be introduced into an internal circuit. The buffer BF1 is an input circuit, output circuit or input-output circuit for signals. The use of the structure shown in FIG. 3 as the resistance element R1 for protection permits the provision of a circuit having an inexpensive and high performance protective resistance element having high reliability.

Figure 4B:
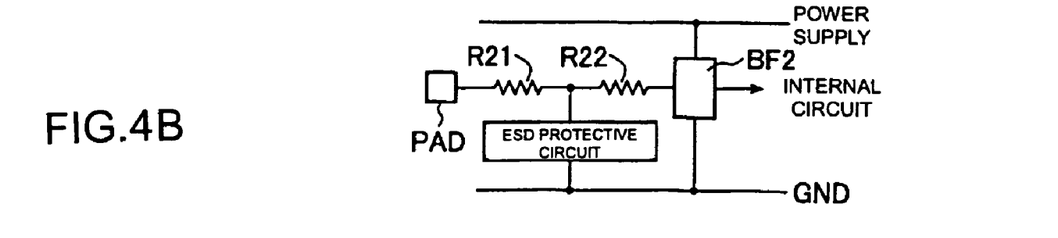

Referring to FIG. 4B, one of signal lines in a semiconductor chip is extended from the pad PAD via resistance elements R21 and R22 for protection to a buffer BF2 so as to be introduced into an internal circuit. The buffer BF2 is an input circuit, output circuit or input-output circuit for signals. Since the size of the buffer BF2 is small and therefore is sensitive to electrostatic damage, an ESD protective circuit is provided between a node between the resistance elements R21 and R22, and a ground potential GND. The use of the structure shown in FIG. 3 as the resistance elements R21 and R22 for protection permits the provision of a circuit having an inexpensive and high performance protective resistance element having high reliability.

Figure 5A:
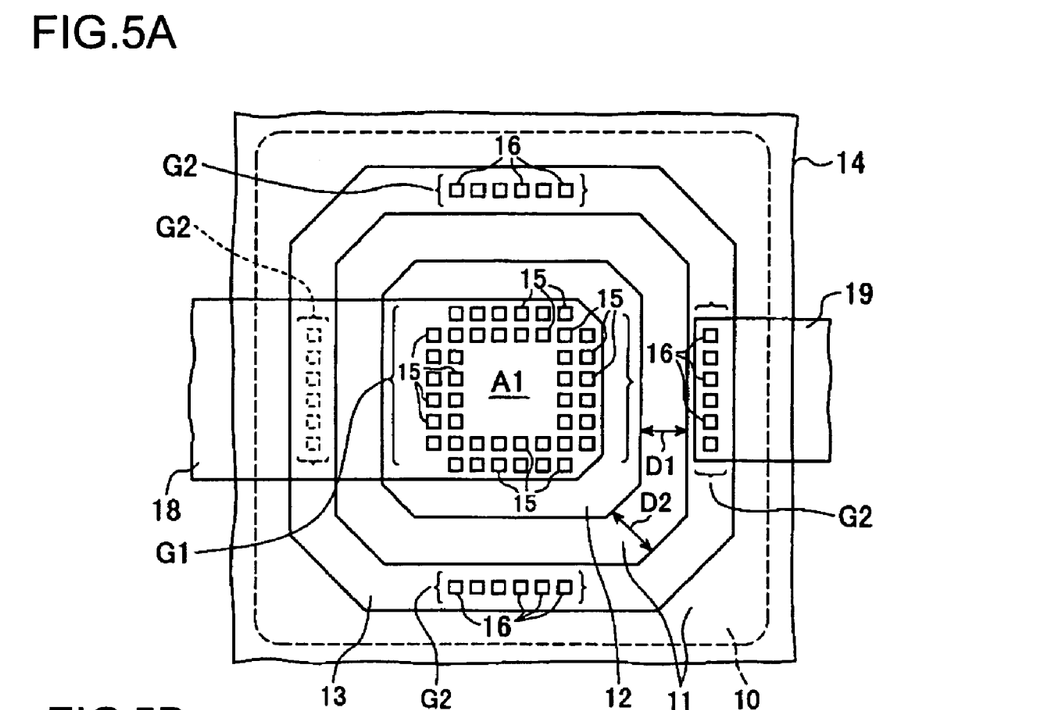
FIGS. 5A and 5B are plan views showing structures of modifications related to the first embodiment.
Figure 5B:
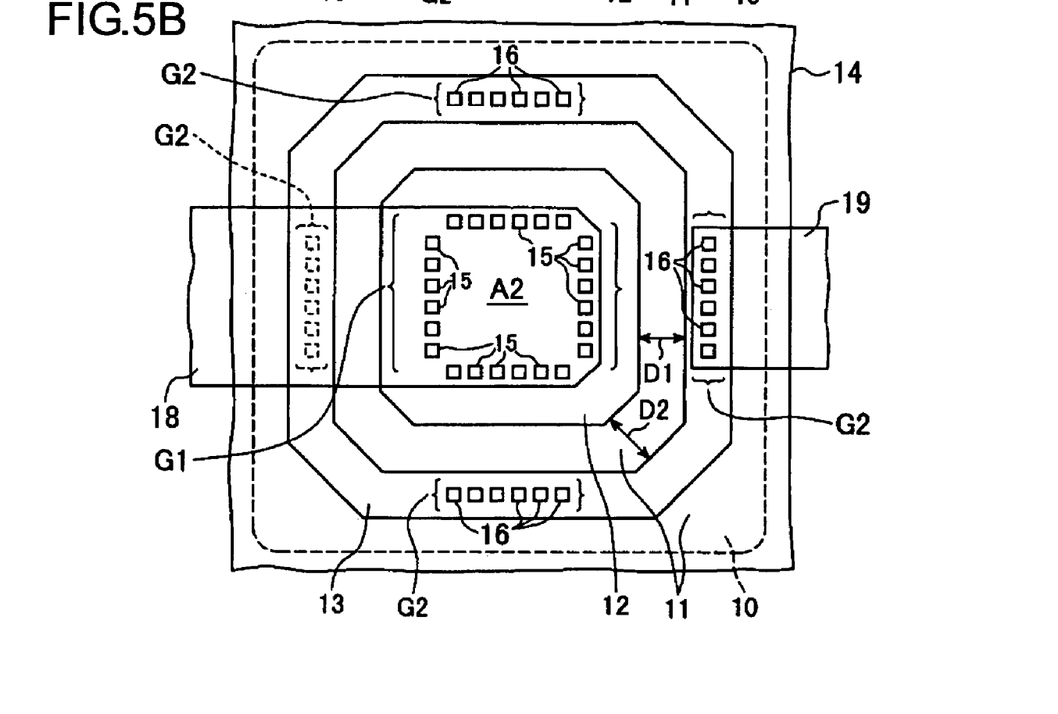

FIGS. 5A and 5B are plan views showing structures according to modifications of the first embodiment. Explanation will be made with using the same numerals as those in FIG. 3.

Of the electrode group G1 on the N-type region 12, the electrodes on the peripheral part of the N-type region 12 actually serve as electrodes for resistance elements. Therefore, referring to FIG. 5A, the electrodes 15 are not provided in a center region A1 but provided in the periphery thereof in two rows. Also, referring to FIG. 5b, the electrodes 15 are not provided in a center region A2 but provided in the periphery thereof in one row.

As above, the electrode group G1 on the N-type region 12 need not necessarily be distributed in the whole region from the center to a predetermined region. It is essential for the electrode group G1 to have the electrodes 15 that are arranged in a predetermined number at least along the four sides of the N-type region 12. Furthermore, the opposite distance D1 between the four sides of the N-type regions 12 and 13 is, at largest, smaller than the opposite distance D2 between the sides of the N-type regions 12 and 13 at four corner regions. In addition, preferably, the electrode group G2 on the N-type region 13 are arranged in a predetermined number so that the electrodes of the electrode group G2 one-to-one face electrodes arranged in a predetermined number at the front rows of the electrode group G1. In other words, both ends of a resistor are made up of one-to-one correspondences between a predetermined number of electrodes and therefore regions preferentially serving as a resistor are established. This allows a structure that is easier to be designed as a resistance element.

Figure 6:
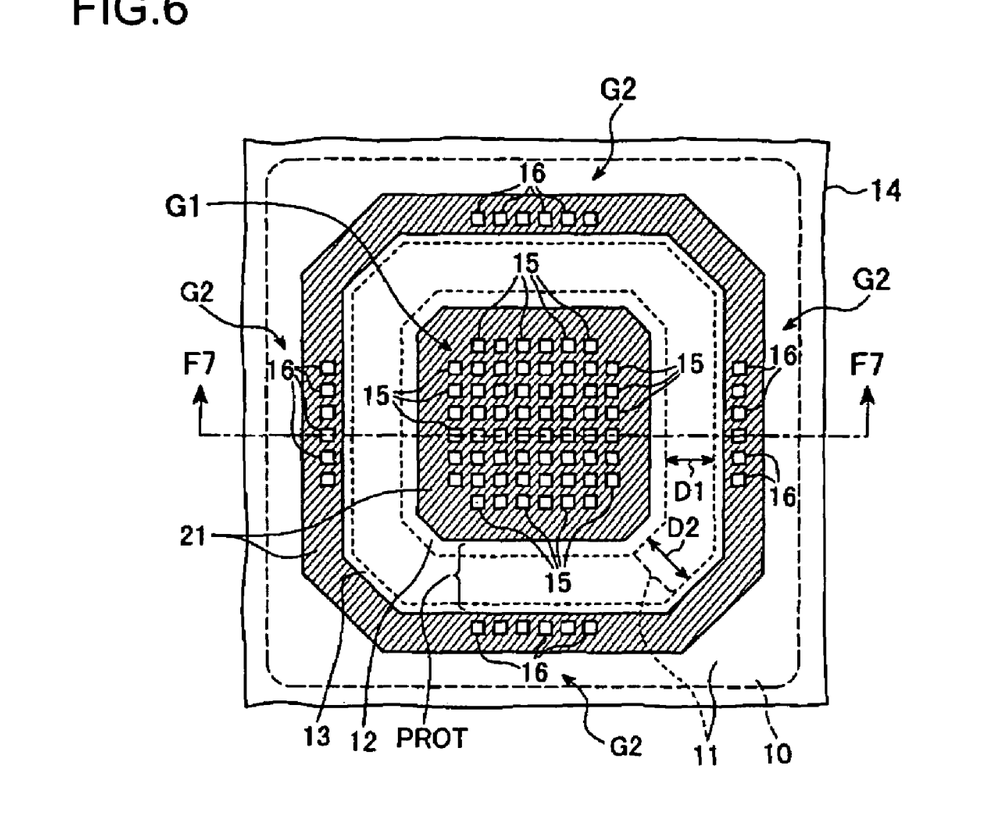
FIG. 6 is a plan view showing an essential part of a semiconductor device according to a second embodiment.
Figure 7:
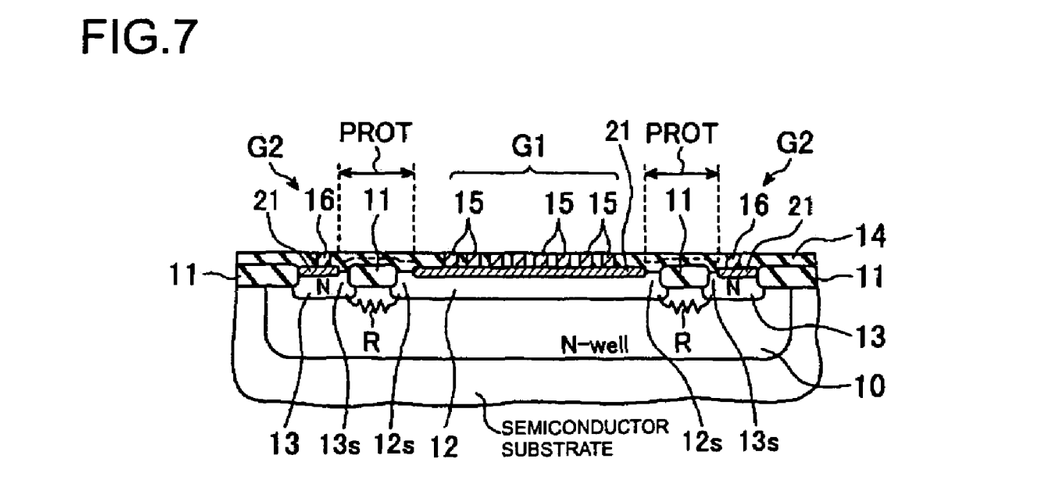
FIG. 7 is a sectional view along line F7-F7 in FIG. 6.

FIG. 6 is a plan view showing an essential part of a semiconductor device according to a second embodiment of the present invention. FIG. 7 is a sectional view along line F7-F7 in FIG. 6. The same numerals as those in FIGS. 1 and 2 are given to the same elements as those in the first embodiment.

The second embodiment is different from the first embodiment in that a step of siliciding the N-type regions 12 and 13 is added and a silicide metal layer 21 is provided in a predetermined region. Other configurations are the same as those of the first embodiment and therefore will not be explained. The silicide metal layer 21 is disposed on the N-type regions 12 and 13 except for predetermined regions adjacent to the insulating film 11 for isolation. The reason for this is that regions free of a silicide metal layer are preferably formed in end (edge) parts of regions serving as a resistor in order to avoid the concentration of charges. Ideally, the device has a fourfold symmetric pattern about the center of the N-type region 12, and the N-type well 10 between the N-type regions 12 and 13 serves as a resistor.

A suicide protect region PROT for achieving a structure to avoid the concentration of charges is illustrated in the drawing. The silicide protect region PROT is an insulating film provided in order to prevent the silicidation of the N-type regions 12 and 13. If the disposition of the silicide protect region PROT involves some misalignment, the same offset of a region in which the silicide metal layer 21 is formed is caused in the N-type regions 12 and 13 equally. This can hold the total balance between regions 12s and 13s that have the silicide metal layer 21 and therefore have low resistivity.

A method for manufacturing a resistance element shown as a structure in FIGS. 6 and 7 is as follows. The insulating film 11 for isolation that is at least annular is formed on the N-type well 10. The insulating film 11 for isolation is formed so that the inner circumference thereof has an octagon shape having at least longitudinal four sides while the outer circumference thereof has four sides facing the four sides of the inner circumference. The width of the region between the four sides is set smaller than that at four corner regions (D1<D2).

Subsequently, an N-type impurity is ion-implanted into the center and peripheral parts of the N-type well 10 with using the insulating film 11 for isolation as a mask, to form the N-type regions 12 and 13. The kind and concentration of the ion depends on N-type regions of other semiconductor elements (not shown) that are formed simultaneously. Then, an insulating film is formed by utilizing chemical vapor deposition (CVD) technique or the like so as to be patterned as the silicide protect region PROT through steps of photolithography and etching. The silicide protect region PROT may be made of the same insulating film as interlayer insulating films, or may be made of another film. At any rate, the silicide protect region PROT is desirably formed with a forming step (silicide protect step) based on a step of manufacturing other semiconductor elements (not shown).

Subsequently, the interlayer insulating film 14 is formed on the whole surface by utilizing chemical vapor deposition (CVD) technique or the like. Thereafter a plurality of openings is formed in a predetermined region of the N-type regions 12 and 13 through steps of photolithography and etching. These openings are formed in the same step as a contact opening step related to other semiconductor elements (not shown).

Then, the electrode group G1 having the plural electrodes 15 are formed on the N-type region 12, and the electrode group G2 having the plural electrodes 16 are formed on the N-type region 13. These electrodes are formed in the same step as a wiring step related to other semiconductor elements (not shown). If a wiring step includes forming of plugs that fill the openings and patterning of a wiring layer, the electrode groups G1 and G2 are formed. However, if patterning of a wiring layer allows simultaneous filling of openings, a wiring pattern is formed simultaneously with the electrode groups G1 and G2. In addition, of the electrode group G2, the electrodes 16 are not formed in a region above which a wiring pattern coupled to the electrode group G1 runs through. Otherwise, a wiring pattern coupled to the electrode group G1 is formed in an upper layer than a layer of a wiring pattern coupled to the electrode group G2. A wiring pattern is formed in the same way as, for example, the wiring patterns 18 and 19, which have been described referring to FIG. 3, although the configuration including the wiring pattern is not illustrated.

The structure and method according to the above embodiment allows the same advantageous effects as those of the first embodiment. Specifically, the annular region of the N-type well 10 between the island N-type region 12 and the annular N-type region 13 serves as a resistor R. Thus, discharge channels for charges applied excessively because of ESD or the like evenly exist in the periphery (four regions) of the N-type region 12. Also, regions free of the silicide metal layer 21 are formed in end (edge) parts of regions serving as the resistor R in order to avoid the concentration of charges. According to this, even if the occupation area of a well region is based on a minimum or near design rule, the larger effective width (length) of a resistance element can be ensured than conventional one. Furthermore, these elements can be formed simultaneously with a step of forming other elements, which provides advantages in manufacturing efficiency and manufacturing costs. Thus, the concentration of charges can be prevented with an inexpensive configuration, and a high performance resistance element that is less subject to damage can be provided. In addition, a resistance element in which a pattern is fourfold symmetric about the center of the electrode group G1 can be formed. This allows greater flexibility in the coupling structure of the electrode group G2. Specifically, an essential part or all of the electrode group G2 can be utilized by using a multi-layered wiring pattern or the like.

There is sufficient possibility that the above second embodiment also adopts the structure according to modifications like that shown in FIGS. 5A and 5B. The same advantageous effects can be expected. In addition, if the above configuration is adopted as a resistance element for protection that is provided upstream of a circuit in an input-output system around an IC chip, a circuit including inexpensive and high performance protective resistance element having high reliability can be provided.

Also, the present invention is not limited to the embodiments in which a well resistor having the N-type well (10) on a semiconductor substrate as a base is shown. A well resistor having a P-type well as a base may be formed. Moreover, a substrate on which a well is to be formed may be a silicon-on-insulator (SOI) substrate.

As described above, the present invention can provide a resistance element employing anti-electrostatic measures that are sufficiently improved even when the occupation area of a well resistor is small. Specifically, a well resistor is achieved by utilizing an annular region between an island conductive coupling region and annular conductive coupling region. This configuration can provide a semiconductor device having an inexpensive and high performance resistance element that can ensure, within a more reduced area, a large area for discharging excess charges due to ESD or the like, and a method for manufacturing the semiconductor device.

What is claimed is:

1. A semiconductor device with electrostatic discharge protection, comprising:
   a semiconductor base of a first conductivity type;
   a first conductive coupling region of the first conductivity type provided on the semiconductor base;
   a second conductive coupling region of the first conductivity type provided on the semiconductor base so as to surround the first conductive coupling region;
   a first electrode group having a plurality of electrodes that is provided on the first conductive coupling region; and
   a second electrode group having a plurality of electrodes that is provided on the second conductive coupling region,
   wherein a peripheral electrode of the first electrode group in a predetermined number is arranged closest to an edge of the first conductive coupling region in each of four regions, and an electrode of the second electrode group in a predetermined number is arranged in each of four regions so as to face the peripheral electrode of the first electrode group.

2. The semiconductor device according to claim 1, wherein the semiconductor base is provided on a semiconductor substrate, and the semiconductor base between the first conductive coupling region and the second conductive coupling region functions as a resistor.

3. The semiconductor device according to claim 1, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

4. A semiconductor device with electrostatic discharge protection, comprising:
   a semiconductor base of a first conductivity type;
   a first conductive coupling region of the first conductivity type provided on the semiconductor base;
   a second conductive coupling region of the first conductivity type provided on the semiconductor base so as to surround the first conductive coupling region;
   a first electrode group having a plurality of electrodes that is provided on the first conductive coupling region; and
   a second electrode group having a plurality of electrodes that is provided on the second conductive coupling region,
   wherein the first electrode group is distributed in a whole region from a center of the first conductive coupling region to a predetermined region, a peripheral electrode of the first electrode group in a predetermined number being arranged closest to an edge of the first conductive coupling region in each of four regions, and an electrode of the second electrode group in a predetermined number being arranged in each of four regions so as to face at least the peripheral electrode of the first electrode group in a predetermined number.

5. The semiconductor device according to claim 4, wherein the semiconductor base is provided on a semiconductor substrate, and the semiconductor base between the first conductive coupling region and the second conductive coupling region functions as a resistor.

6. The semiconductor device according to claim 4, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

7. A semiconductor device with electrostatic discharge protection, comprising:
   a semiconductor base of a first conductivity type;
   a first conductive coupling region of the first conductivity type provided on the semiconductor base;
   a second conductive coupling region of the first conductivity type provided on the semiconductor base so as to surround the first conductive coupling region;
   a first electrode group having a plurality of electrodes that is provided on the first conductive coupling region; and
   a second electrode group having a plurality of electrodes that is provided on the second conductive coupling region,
   wherein the first conductive coupling region has a planar shape obtained by removing four corner parts from a quadrangle and having at least four sides, the first electrode group being prepared so that an electrode in a predetermined number is arranged along the four sides, and an electrode of the second electrode group in a predetermined number being arranged so as to face at least the electrode of the first electrode group in a predetermined number.

8. The semiconductor device according to claim 7, wherein the semiconductor base is provided on a semiconductor substrate, and the semiconductor base between the first conductive coupling region and the second conductive coupling region functions as a resistor.

9. The semiconductor device according to claim 7, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

10. A semiconductor device with electrostatic discharge protection, comprising:
a semiconductor base of a first conductivity type;
a first conductive coupling region of the first conductivity type provided on the semiconductor base;
a second conductive coupling region of the first conductivity type provided on the semiconductor base so as to surround the first conductive coupling region;
a first electrode group having a plurality of electrodes that is provided on the first conductive coupling region; and
a second electrode group having a plurality of electrodes that is provided on the second conductive coupling region,
wherein a distance between the first conductive coupling region and the second conductive coupling region in a region in which the first electrode group faces the second electrode group is smaller than a distance between the first conductive coupling region and the second conductive coupling region in other regions.

11. The semiconductor device according to claim 10, wherein the semiconductor base is provided on a semiconductor substrate, and the semiconductor base between the first conductive coupling region and the second conductive coupling region functions as a resistor.

12. The semiconductor device according to claim 10, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

13. A semiconductor device with electrostatic discharge protection comprising:
a semiconductor base of a first conductivity type;
a first insulating film provided on the semiconductor base;
a first conductive coupling region of the first conductivity type in a center part and a second conductive coupling region of the first conductivity type surrounding the first conductive coupling region, the first and second conductive coupling regions being isolated from each other by the first insulating film;
a second insulating film provided on the first conductive coupling region and the second conductive coupling region;
a first electrode group having a plurality of electrodes that is provided on the first conductive coupling region via a plurality of openings in the second insulating film;
a second electrode group having a plurality of electrodes that is provided on the second conductive coupling region via a plurality of openings in the second insulating film;
a first wiring pattern coupled to a plurality of predetermined electrodes of the first electrode group; and
a second wiring pattern coupled to a plurality of predetermined electrodes of the second electrode group,
wherein a peripheral electrode of the first electrode group in a predetermined number is arranged closest to an edge of the first conductive coupling region in each of four regions, and an electrode of the second electrode group in a predetermined number is arranged in each of four regions so as to face the peripheral electrode of the first electrode group.

14. The semiconductor device according to claim 13, wherein a silicide metal layer is formed in the first conductive coupling region and the second conductive coupling region except for a predetermined region adjacent to the first insulating film.

15. The semiconductor device according to claim 13, wherein the semiconductor base is provided on a semiconductor substrate, and the semiconductor base between the first conductive coupling region and the second conductive coupling region functions as a resistor.

16. The semiconductor device according to claim 13, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

17. A semiconductor device with electrostatic discharge protection comprising:
a semiconductor base of a first conductivity type;
a first insulating film provided on the semiconductor base;
a first conductive coupling region of the first conductivity type in a center part and a second conductive coupling region of the first conductivity type surrounding the first conductive coupling region, the first and second conductive coupling regions being isolated from each other by the first insulating film;
a second insulating film provided on the first conductive coupling region and the second conductive coupling region;
a first electrode group having a plurality of electrodes that is provided on the first conductive coupling region via a plurality of openings in the second insulating film;
a second electrode group having a plurality of electrodes that is provided on the second conductive coupling region via a plurality of openings in the second insulating film;
a first wiring pattern coupled to a plurality of predetermined electrodes of the first electrode group; and
a second wiring pattern coupled to a plurality of predetermined electrodes of the second electrode group,
wherein the first electrode group is distributed in a whole region from a center of the first conductive coupling region to a predetermined region, a peripheral electrode of the first electrode group in a predetermined number being arranged closest to an edge of the first conductive coupling region in each of four regions, and an electrode of the second electrode group in a predetermined number being arranged in each of four regions so as to face at least the peripheral electrode of the first electrode group in a predetermined number.

18. The semiconductor device according to claim 17, wherein a silicide metal layer is formed in the first conductive coupling region and the second conductive coupling region except for a predetermined region adjacent to the first insulating film.

19. The semiconductor device according to claim 17, wherein the semiconductor base is provided on a semiconductor substrate, and the semiconductor base between the first conductive coupling region and the second conductive coupling region functions as a resistor.

20. The semiconductor device according to claim 17, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

21. A semiconductor device with electrostatic discharge protection comprising:
- a semiconductor base of a first conductivity type;
- a first insulating film provided on the semiconductor base;
- a first conductive coupling region of the first conductivity type in a center part and a second conductive coupling region of the first conductivity type surrounding the first conductive coupling region, the first and second conductive coupling regions being isolated from each other by the first insulating film;
- a second insulating film provided on the first conductive coupling region and the second conductive coupling region;
- a first electrode group having a plurality of electrodes that is provided on the first conductive coupling region via a plurality of openings in the second insulating film;
- a second electrode group having a plurality of electrodes that is provided on the second conductive coupling region via a plurality of openings in the second insulating film;
- a first wiring pattern coupled to a plurality of predetermined electrodes of the first electrode group; and
- a second wiring pattern coupled to a plurality of predetermined electrodes of the second electrode group,
- wherein the first conductive coupling region has a planar shape obtained by removing four corner parts from a quadrangle and having at least four sides, the first electrode group being prepared so that an electrode in a predetermined number is arranged along the four sides, and an electrode of the second electrode group in a predetermined number being arranged so as to face at least the electrode of the first electrode group in a predetermined number.

22. The semiconductor device according to claim 21, wherein a silicide metal layer is formed in the first conductive coupling region and the second conductive coupling region except for a predetermined region adjacent to the first insulating film.

23. The semiconductor device according to claim 21, wherein the semiconductor base is provided on a semiconductor substrate, and the semiconductor base between the first conductive coupling region and the second conductive coupling region functions as a resistor.

24. The semiconductor device according to claim 21, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

25. A semiconductor device with electrostatic discharge protection comprising:
- a semiconductor base of a first conductivity type;
- a first insulating film provided on the semiconductor base;
- a first conductive coupling region of the first conductivity type in a center part and a second conductive coupling region of the first conductivity type surrounding the first conductive coupling region, the first and second conductive coupling regions being isolated from each other by the first insulating film;
- a second insulating film provided on the first conductive coupling region and the second conductive coupling region;
- a first electrode group having a plurality of electrodes that is provided on the first conductive coupling region via a plurality of openings in the second insulating film;
- a second electrode group having a plurality of electrodes that is provided on the second conductive coupling region via a plurality of openings in the second insulating film;
- a first wiring pattern coupled to a plurality of predetermined electrodes of the first electrode group; and
- a second wiring pattern coupled to a plurality of predetermined electrodes of the second electrode group,
- wherein a distance between the first conductive coupling region and the second conductive coupling region in a region in which the first electrode group faces the second electrode group is smaller than a distance between the first conductive coupling region and the second conductive coupling region in other regions.

26. The semiconductor device according to claim 25, wherein a suicide metal layer is formed in the first conductive coupling region and the second conductive coupling region except for a predetermined region adjacent to the first insulating film.

27. The semiconductor device according to claim 25, wherein the semiconductor base is provided on a semiconductor substrate, and the semiconductor base between the first conductive coupling region and the second conductive coupling region functions as a resistor.

28. The semiconductor device according to claim 25, wherein the semiconductor base is provided on a semiconductor substrate, and has a pattern that is at least fourfold symmetric about a center of the first conductive coupling region, the semiconductor base between the first conductive coupling region and the second conductive coupling region functioning as a resistor.

\* \* \* \* \*